(12) United States Patent
Kerstein et al.

(10) Patent No.: US 6,393,548 B1
(45) Date of Patent: May 21, 2002

(54) VARIABLE 16 OR 32 BIT PCI INTERFACE WHICH SUPPORTS STEERING AND SWAPPING OF DATA

(75) Inventors: Denise Kerstein, Mountain View; Philip Simmons, San Jose; Richard Relph, Santa Clara; Govind Kizhepat, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 08/993,046

(22) Filed: Dec. 18, 1997

Related U.S. Application Data

(60) Provisional application No. 60/038,025, filed on Feb. 14, 1997.

(51) Int. Cl.[7] .............................................. G06F 15/00
(52) U.S. Cl. ............................ 712/43; 710/10; 710/66; 710/104
(58) Field of Search ...................... 395/800.01, 800.28, 395/800.32, 800.33, 800.43; 710/127, 129, 126, 130, 131, 100, 101, 10, 66, 104, 19; 712/1, 28, 32, 33, 43

(56) References Cited

U.S. PATENT DOCUMENTS

| | | | | |
|---|---|---|---|---|
| 4,219,874 A | * | 8/1980 | Gusev et al. ............... 712/300 |
| 4,580,134 A | * | 4/1986 | Campbell et al. ........... 345/152 |
| 4,716,527 A | * | 12/1987 | Graciotti ..................... 710/127 |
| 4,779,190 A | * | 10/1988 | O'Dell et al. ............... 395/500 |
| 5,191,581 A | * | 3/1993 | Woodbury et al. .......... 370/364 |
| 5,243,699 A | * | 9/1993 | Nickolls et al. ............. 712/11 |
| 5,265,237 A | * | 11/1993 | Tobias et al. ................ 710/65 |
| 5,331,315 A | * | 7/1994 | Crosetto ................ 340/825.02 |
| 5,392,406 A | * | 2/1995 | Petersen et al. ............. 710/131 |
| 5,515,376 A | | 5/1996 | Murphy et al. ........... 370/85.13 |
| 5,557,758 A | * | 9/1996 | Bland et al. ................. 395/308 |
| 5,561,819 A | * | 10/1996 | Gephardt et al. ............. 710/27 |
| 5,664,122 A | * | 9/1997 | Rabe et al. .................. 710/128 |
| 5,721,957 A | * | 2/1998 | Huang et al. ................. 710/66 |
| 5,734,850 A | * | 3/1998 | Kenny et al. ............... 710/129 |
| 5,761,443 A | * | 6/1998 | Kranich ....................... 710/100 |
| 5,761,450 A | * | 6/1998 | Shah ........................... 710/107 |
| 5,771,359 A | * | 6/1998 | Galloway et al. ............ 395/308 |
| 5,778,406 A | * | 7/1998 | Willard ........................... 711/1 |
| 5,793,992 A | * | 8/1998 | Steele et al. ................. 710/113 |
| 5,799,161 A | * | 8/1998 | Merrick ....................... 710/129 |
| 5,805,868 A | * | 9/1998 | Murphy ....................... 395/502 |
| 5,828,853 A | * | 10/1998 | Regal .......................... 710/128 |
| 5,903,496 A | * | 5/1999 | Kendall et al. ......... 365/185.12 |
| 6,041,010 A | * | 3/2000 | Puar et al. ................... 365/226 |

* cited by examiner

Primary Examiner—Mark Zimmerman
Assistant Examiner—Mackly Monestime

(57) ABSTRACT

A PCI interface is provided to support a 16- or 32-bit PCI host employing little-endian or big-endian byte ordering. The PCI interface may be arranged on a multiport switch to enable a PCI host to access internal registers and an external memory via a PCI bus. When a 16-bit PCI host is provided with access to a 32-bit internal register, two consecutive 16-bit data transfers are performed. The first 16 bits of data are temporarily stored in a holding register until the following 16 bits are transferred. The PCI host accesses the external memory via posting write buffers and prefetch read buffers arranged between an external memory interface and the PCI interface. When the multiport switch is configured to support a big-endian PCI host, bytes of a word transferred between the external memory and a write or read buffer are swapped to rearrange byte ordering of the word. A data steering means is arranged between the PCI bus and the write or read buffer to connect required pins of the PCI interface with a required location in the buffer.

15 Claims, 10 Drawing Sheets

VARIABLE 16 OR 32 BIT PCI INTERFACE WHICH SUPPORTS STEERING AND SWAPPING OF DATA

The present application claims the priority of provisional application No. 60/038,025, filed Feb. 14, 1997.

TECHNICAL FIELD

The present invention relates to the field of digital computer systems and, more particularly, to a chip having a PCI interface that supports access for both 16- and 32-bit PCI hosts employing little-endian or big-endian byte ordering.

BACKGROUND ART

In computer systems, electronic chips and other components are connected with one another by buses. A variety of components can be connected to the bus, providing intercommunication between all of the devices that are connected to the bus. One type of bus which has gained wide industry acceptance is the peripheral component interconnect (PCI) bus. The PCI bus may be a 32-bit pathway for high-speed data transfer. Essentially, the PCI bus is a parallel data path that may be attached directly to a system host processor and a memory.

The address and data signals on the PCI bus are time multiplexed on the same 32 pins (AD0 through AD31). On the one clock cycle, the combined address/data lines carry the address values and set up the location to move information to or from. On the next cycle, the same lines switch to carrying the actual data.

The PCI bus anticipates all devices following the PCI standard will use its full 32-bit bus width. However, it would be desirable to provide a chip having a PCI interface that allows both 16- and 32-bit host processors to access the chip via a PCI bus.

Further, some processors, such as Intel processors, employ little-endian byte ordering that requires the most significant byte to be in the left-most position. Other processors, such as Motorola processors, use big-endian byte ordering that requires the most significant byte to be in the right-most position.

Moreover, a 16-bit little-endian PCI host drives all address bits AD0 to AD31 during the address phase of a PCI transfer, but must transfer data on AD15 to AD0 during the data phase of the transfer. By contrast, a 16-bit big-endian PCI host drives all address bits AD0 to AD31 during the address phase of a transfer, but must transfer data on AD31 to AD16 during the data phase of the transfer.

Thus, it would be desirable to provide a PCI interface that supports little-endian host processors as well as big-endian host processors.

DISCLOSURE OF THE INVENTION

Accordingly, an advantage of the present invention is in providing a chip having a PCI interface that allows both 16- and 32-bit host processors to access internal registers on the chip and an external memory via a PCI bus.

Another advantage of the present invention is in providing a PCI interface that supports little-endian host processors as well as big-endian host processors.

The above and other advantages of the invention are achieved, at least in part, by providing a system for enabling a host to access a memory means via a PCI bus. The memory means may include internal registers of a data communication switch and a memory device external with respect to the switch. Write and read buffers may be arranged on the switch for temporarily storing data transferred between the PCI bus and the memory device. A PCI interface arranged on the switch for transferring data between the PCI bus and the memory means may be adjustable to support a first PCI host that handles words of first length and a second PCI host that handles words of second length different from the first length. For example, the PCI interface may support 16- and 32-bit host processors.

In accordance with a first aspect of the present invention, a data steering means may be provided for connecting predetermined data paths of the PCI bus to a predetermined location of the buffer means in response to a data steering signal. For example, the data steering means allows a 16-bit host to perform an 8- or 16-bit read or write access to the memory device.

In accordance with another aspect of the present invention, a byte swapping means may be provided for changing the order of bytes in a data word when the data word is transferred between the memory device and the buffer. In response to a first byte swapping signal, the order of bytes in the data word may be changed, whereas a second swapping signal may maintain the order of bytes in the data word. For example, the first byte swapping signal may be produced when the switch is configured to support a big-endian host processor. The second byte swapping signal may be generated when the switch is configured to support a little-endian host processor.

In accordance with a further aspect of the present invention, a holding register may be provided between an internal register of the switch and the PCI bus. A plurality of consecutive data transfers may be performed for supporting host accesses to the internal register. The holding register temporarily stores data of a first data transfer and transmits the stored data to the internal register when the host performs a second data transfer directly to the internal register. For example, the holding register may enable a 16-bit host to access a 32-bit internal register using two consecutive 16-bit data transfers.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
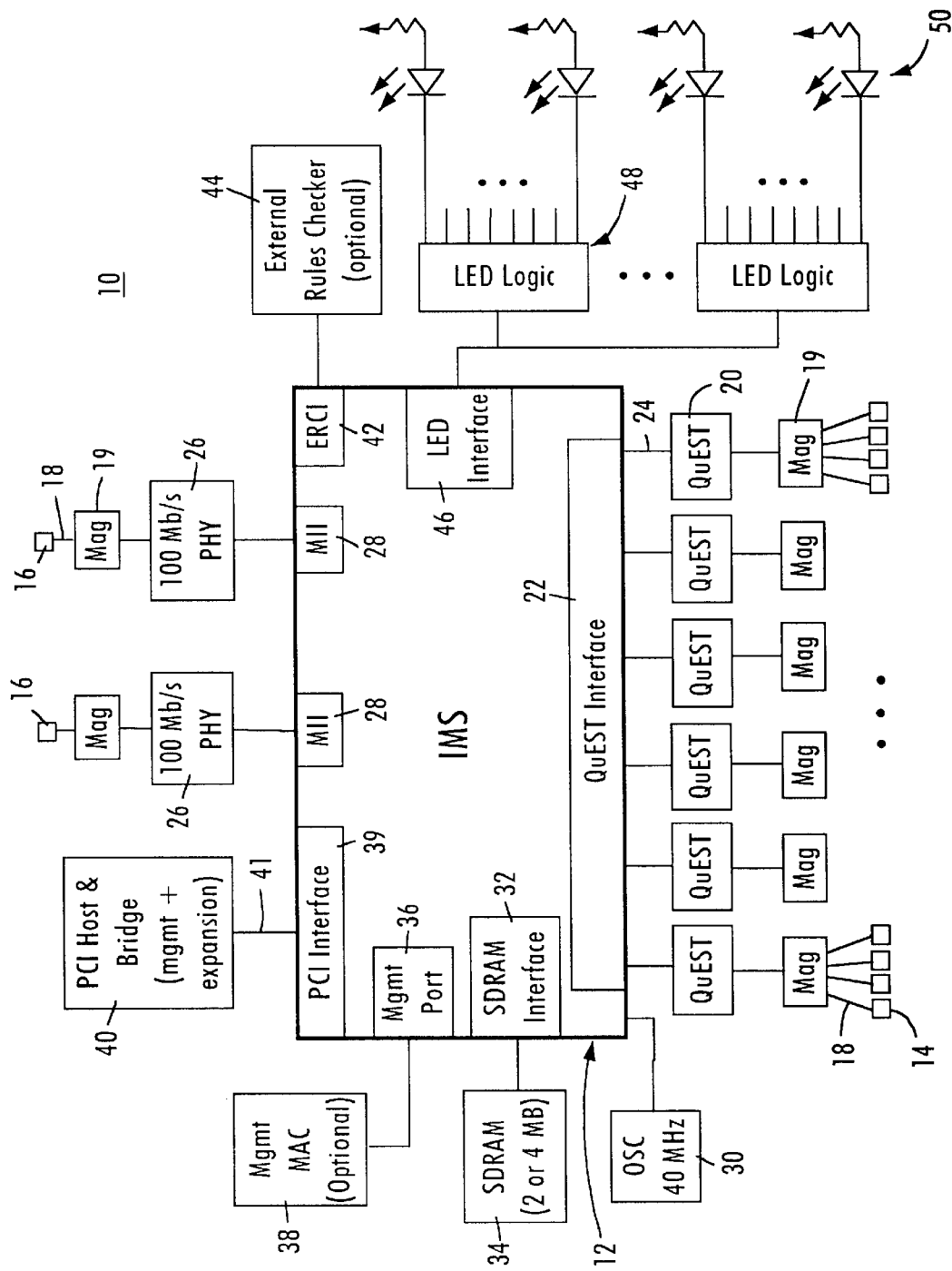
FIG. 1 is a block diagram of an exemplary system in which the present invention may be advantageously employed.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carriersense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100 Mb/s network station 16 and the multiport switch 12, where the IMS and the respective stations 16 can simultaneously transmit and receive data packets without collisions. The 100 Mb/s network stations 16 each are coupled to network media 18 via 100 Mb/s physical (PHY) devices 26 of type 100 Base-TX, 100 Base-T4, or 100 Base-FX. The multiport switch 12 includes a media independent interface (MII) 28 that provides a connection to the physical devices 26. The 100 Mb/s network stations 16 may be implemented as servers or routers for connection to other networks. The 100 Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ) interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 via a management MAC interface 38. Also, the multiport switch 12 includes a PCI interface 39 connected to a host processor 40 via a PCI bus 41. The PCI interface 39 enables the PCI host processor 40 to access the internal IMS registers and the external memory 34. Alternatively, a PCI expansion bus may be attached to the PCI interface 39 to connect the switch 12 to other IMS devices.

The multiport switch 12 includes an internal decision making engine that selectively transmits data packets received from one source to at least one destination station. The internal decision making engine may be substituted with an external rules checker. The multiport switch 12 includes an external rules checker interface (ERCI) 42 that allows use of an external rules checker 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 48 provides a 40 MHz clock input for the system functions of the multiport switch 12.

Figure 2A:
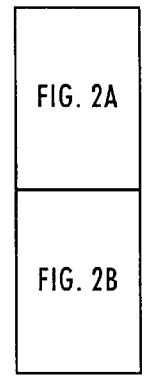
FIG. 2 is a block diagram of a multiport switch.
Figure 2A:
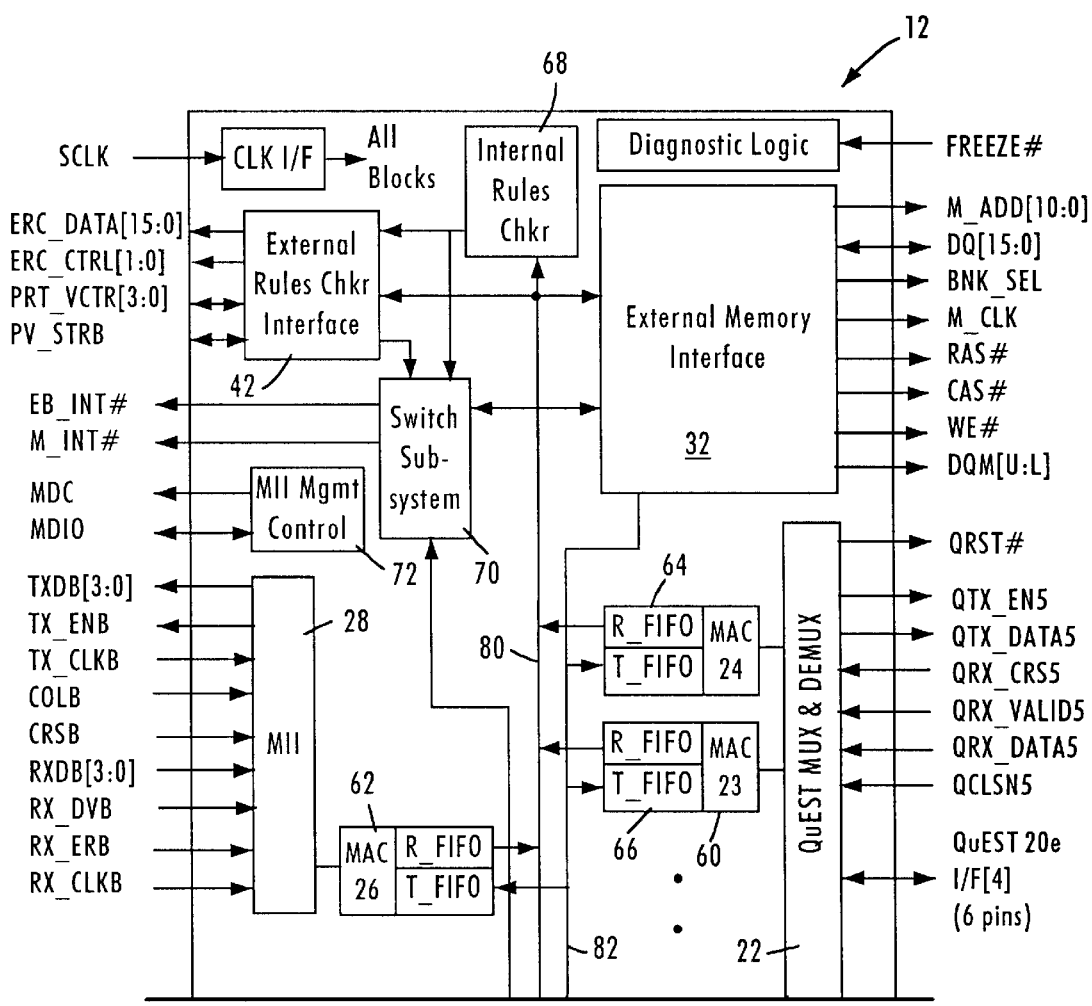
Figure 2B:
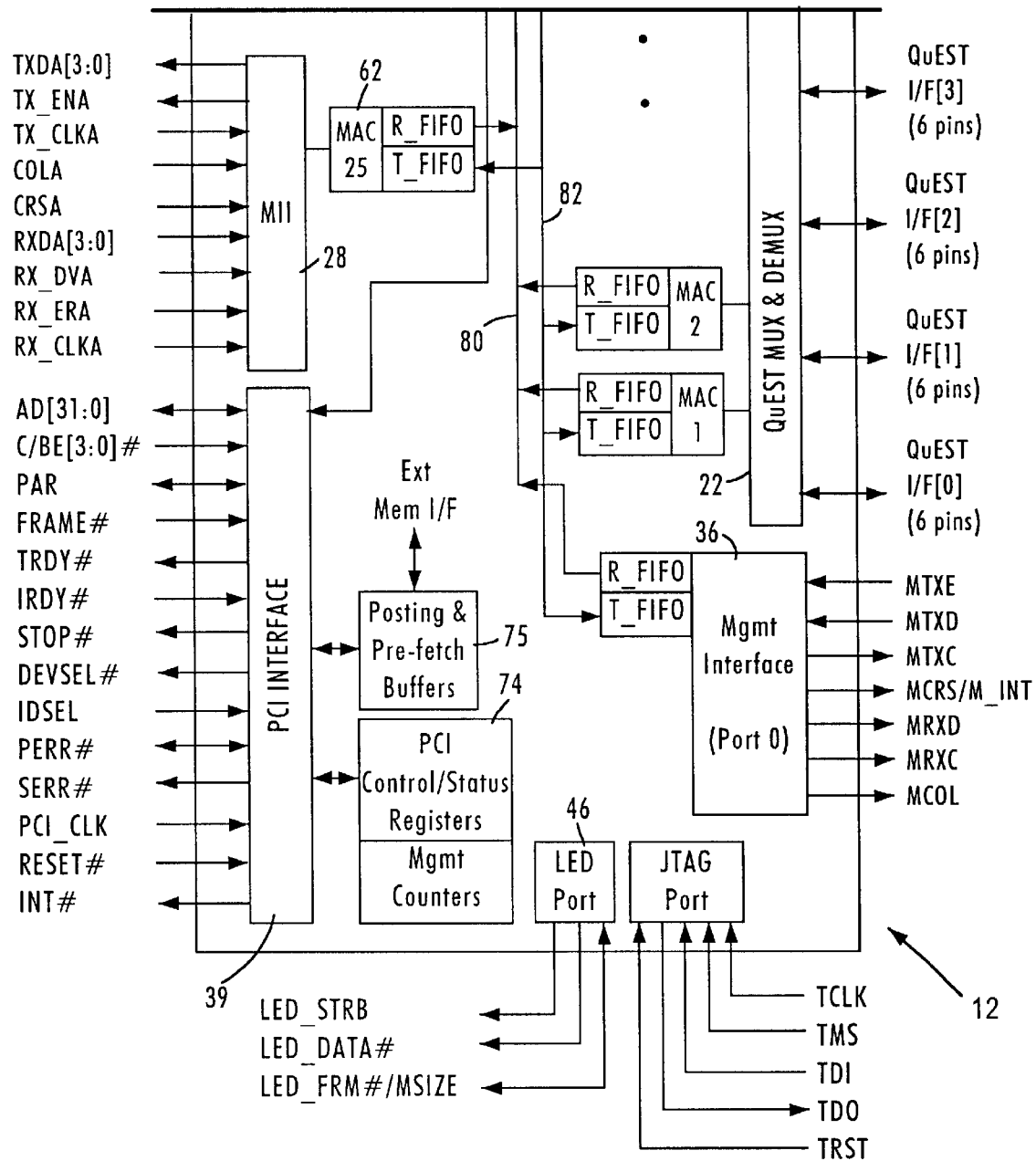

FIG. 2 is a block diagram of the multiport switch 12 of FIG. 1. The multiport switch 12 includes twenty-four (24) 10

Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first in-first out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

The header of the received packet is also forwarded to a decision making engine, comprising an internal rules checker 68 and an external rules checker interface 32, to determine which MAC ports will output the data packet. Specifically, the packet header is forwarded to an internal rules checker 68 or the external rules checker interface 42, depending on whether the multiport switch 12 is configured to operate using the internal rules checker 68 or the external rules checker 44. The internal rules checker 68 and external rules checker 44 provide the decision making logic for determining the destination MAC port for a given data packet. The decision making engine may thus output a given data packet to either a single port, multiple ports, or all ports (i.e., broadcast). For example, each data packet includes a header having source and destination address, where the decision making engine may identify the appropriate output MAC port based upon the destination address. Alternatively, the destination address may correspond to a virtual address that the appropriate decision making engine identifies as corresponding to a plurality of network stations. Alternatively, the received data packet may include a VLAN (virtual LAN) tagged frame according to IEEE 802.1d protocol that specifies another network (via a router at one of the 100 Mb/s stations 16) or a prescribed group of stations. Hence, either the internal rules checker 68 or the external rules checker 44 via the interface 42 will decide whether a frame temporarily stored in the buffer memory 34 should be output to a single MAC port or multiple MAC ports.

Use of the external rules checker 44 provides advantages such as increased capacity, a random-based ordering in the decision queue that enables frame forwarding decisions to be made before the frame is completely buffered to external memory, and enables decisions to be made in an order independent from the order in which the frames were received by the multiport switch 12.

The decision making engine (i.e., internal rules checker 68 or the external rules checker 44) outputs a forwarding decision to a switch subsystem 70 in the form of a port vector identifying each MAC port that should receive the data packet. The port vector from the appropriate rules checker includes the address location storing the data packet in the external memory 34, and the identification of the MAC ports to receive the data packet for transmission (e.g., MAC ports 0–26). The switch subsystem 70 fetches the data packet identified in the port vector from the external memory 34 via the external memory interface 32, and supplies the retrieved data packet to the appropriate transmit FIFO 66 of the identified ports.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u) . For example, the management data interface 72 outputs a management data clock (MDC) providing a timing reference on the bidirectional management data IO (MDIO) signal path.

The PCI interface 39 may be a 32-bit PCI revision 2.1 compliant slave interface for providing the PCI host processor 40 with access to internal IMS status and configuration registers 74, and to the external memory SDRAM 34. Write posting and read prefetch buffers 75 are arranged between the PCI interface 39 and the external memory interface to support host processor access to the external memory 34. The PCI interface 39 can also be coupled to an expansion bus for connecting multiple IMS devices with each other.

The management port 36 interfaces to an external MAC engine through a standard seven-wire inverted serial GPSI interface, enabling a host controller access to the multiport switch 12 via a standard MAC layer protocol.

Figure 3:
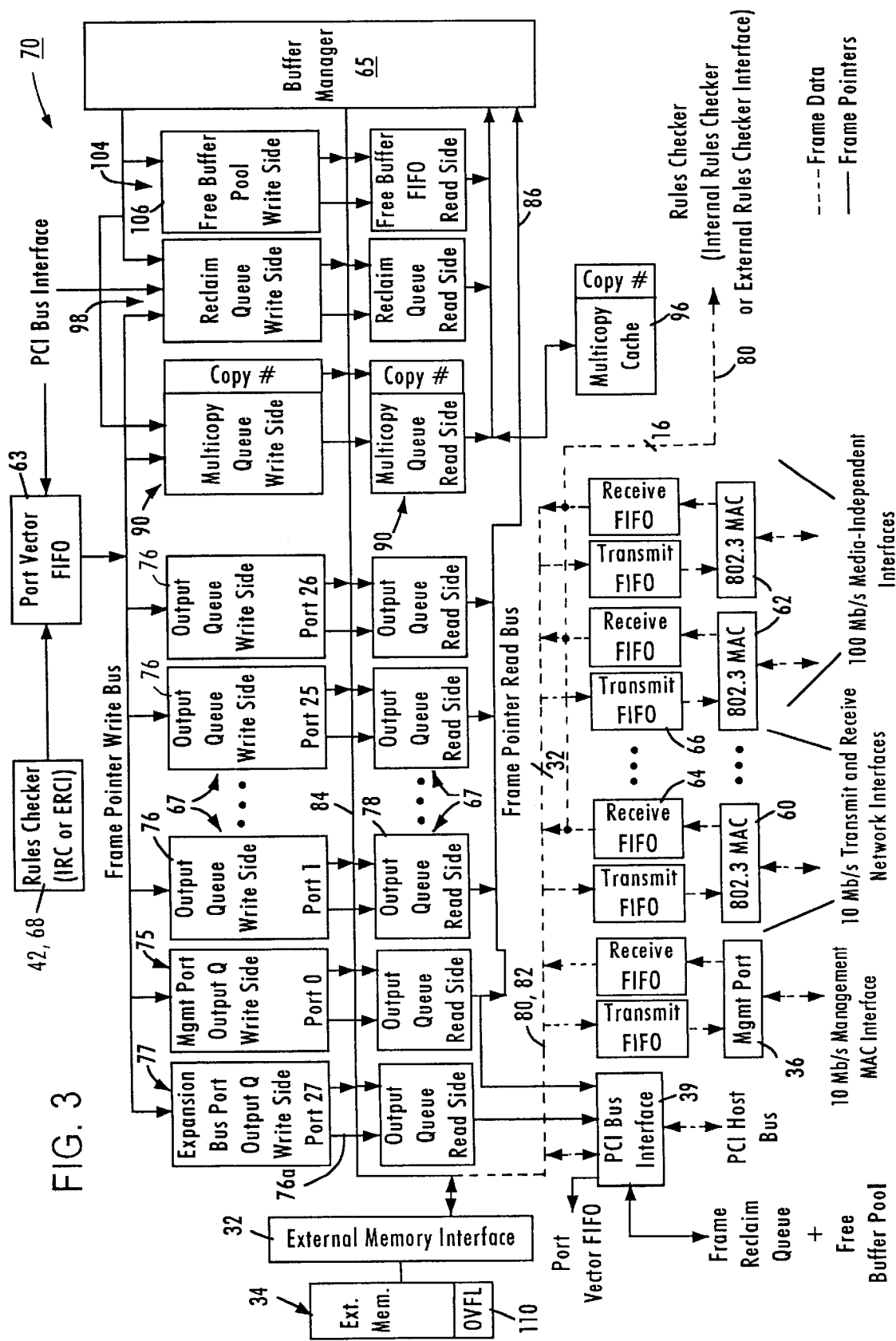
FIG. 3 depicts the switch subsystem of the multiport switch according to an exemplary embodiment of the present invention.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98. The operation and structure of these functional blocks will be described in more detail, but a brief overview of the switch subsystem 70 of FIG. 3 is first presented to provide context to the later discussion of the individual elements.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header is provided to a rules checker (i.e., either the internal rules checker 68 or the external rules checker interface 42). The rules checker, based on the information in the header, determines from where the frame packet will be cast, i.e., through which port or ports will the frame packet be transmitted.

At the same time as the rules checker 42 or 68 is making its forwarding determination, the buffer manager 65 obtains a free frame pointer from the free buffer pool 104. The free frame pointer specifies a location in external memory 36 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

The buffer manager 65 also sends the free frame pointer to the rules checker 42 or 68 to enable the appropriate rules checker to process the header information while maintaining the storage location of the data frame. This free buffer pointer is now referred to merely as a frame pointer, since it points to the memory location in the external memory 34 where the frame is stored. The rules checker 42 or 68 makes the forwarding decision, where the rules checker identifies at least one destination port for the data frame stored in the external memory 34 based on the corresponding header information, and generates a forwarding instruction in the form of a "port vector". In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 42 or 68. Hence, the rules checker uses the port vector to assign the frame pointer to at least one destination port.

The rules checker 42 or 68 places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

A multicopy transmission is similar to the unicopy transmission, except that the port vector has multiple bits set, designating the multiple destination ports from which the frame will be transmitted. The frame pointer is assigned (i.e., stored in) each of the appropriate output queues 67 and transmitted from the corresponding transmit FIFOs 54.

The buffer manager 65 uses the special control queues, e.g., the free buffer pool 104, the multicopy queue 90, the reclaim queue 98, and the multicopy cache 96 to manage the process of allocating buffers to store received data frames, and retrieving buffers for re-use once the frame has been transmitted to its designated output port(s). The buffer manager 65 also maintains "overflow" regions in external memory 36 for the output queues 67, 75, 77 and the control queues 104, 90 and 98. Specifically, these queues each include a three-part configuration including on-chip and off-chip storage locations. On-chip storage is preferable for high performance, where all of the queuing structure is maintained on the chip (referring to the multiport switch 12). However, the real estate on a chip is very expensive and real estate costs create a problem when the chip is designed to switch, and needs to queue, a large number of entries. The present invention solves this dilemma by providing a single output queue that includes a high performance, low capacity section that is on-chip, and an overflow area that is off-chip, i.e., is implemented on a separate discrete memory chip 34. The overflow area thus allows the queue to serve as a large capacity queue as needed and is configured within the output queue in a manner that a relatively lower performance of the off-chip overflow area does not adversely affect the overall performance of the output queue.

Each logical queue 67, 75, 77, 90, 98, and 104 of the present invention includes a write-side queue 76 and a read-side queue 78 located on the chip 12, and an output queue overflow area (generally designated as 110) located in an assigned portion of the external memory 34. Access to the external memory 34 for all of the output queues 67 is through the external memory interface 32, as described earlier. The present invention takes advantage of the bursting nature of current external memories, so that the overflow data (e.g., frame pointers) is sent on and off the chip to the overflow queue area 110 in bursts over the bus 84 to the external memory 34.

The write-side queue 76 and the read-side queue 78 located on the chip 12 are considered to be small, expensive, and high-performance resources. By contrast, the overflow area 110, forming the third part of the output queue 67, provides a large, inexpensive, low-performance, large capacity path.

Each buffer 67, 75, 77, 90, 98, and 104 operates by the corresponding write-side queue 76 receiving the corresponding frame pointer entry at an input end of the write-side queue 76. The frame pointer points to the first buffer location in external memory storing the first 256 bytes of a data frame.

After the entry flows through and reaches the output end at the bottom of the write-side queue 76, control logic associated with the output queue 67 selects whether the entry should be output to the corresponding assigned portion 110 of the external memory 34 or the read-side queue 78. If there is available space in the read-side queue 78 and the overflow area 110 for that output queue 67 is empty, then one or more entries are passed directly from the write-side queue 76 to the read-side queue 78. This passing of the entry or entries directly from the write-side queue 76 to the read-side queue 78 is performed entirely on the chip 12 and, thus, provides a low-latency, fast flow-through of an entry.

If the read-side queue 78 is full but there is not yet a burst-size amount of data in the write-side queue 76, then the entry remains in the write-side queue 76. If the read-side queue 78 is full and there is at least a burst-size amount of data (e.g., 16 bytes worth of entries) in the write-side queue 76, then the data is written in a burst fashion by the buffer manager 65 into the overflow area 110 in the corresponding assigned portion of the external memory 34. Eventually, the read-side queue 78 will empty and, if there is data in the overflow area 110, the buffer manager 65 will supply a burst of data from the overflow area 110 into the read-side queue 78 when the read-side queue 78 has enough space to accommodate the burst-size amount of data. Hence, the read-side queue 78 selectively receives the frame pointer from the write-side queue 76 or the assigned portion 110 of the external memory 34.

Hence, if an output queue 67 begins to receive a large number of entries (e.g., frame pointers), these entries can be placed into the overflow area 110 to avoid overflowing the on-chip queue 78, minimizing possibility of discarding frames. The total amount of memory dedicated to the overflow areas 110 may also be readily changed by changing the size of the external memory 36. Furthermore, the sizes of the individual specific overflow areas 110 are programmable to customize the queue sizes, without impacting the performance of the output queues 74.

The multiport switch as depicted in FIGS. 1 and 2 has twenty-eight output queues serving the twenty-four 10 Mb/s user ports 60, the two 100 Mb/s server ports 62, the management port 36, and the expansion bus port 38, respectively. The output queues 67, 75 and 77 provide temporary storage for frame pointers when they are queued for transmission. Queuing takes the form of the port vector FIFO 70 writing frame pointers into the various output queues 67, 75 and 77 indicated in a forwarding port vector.

Figure 4:
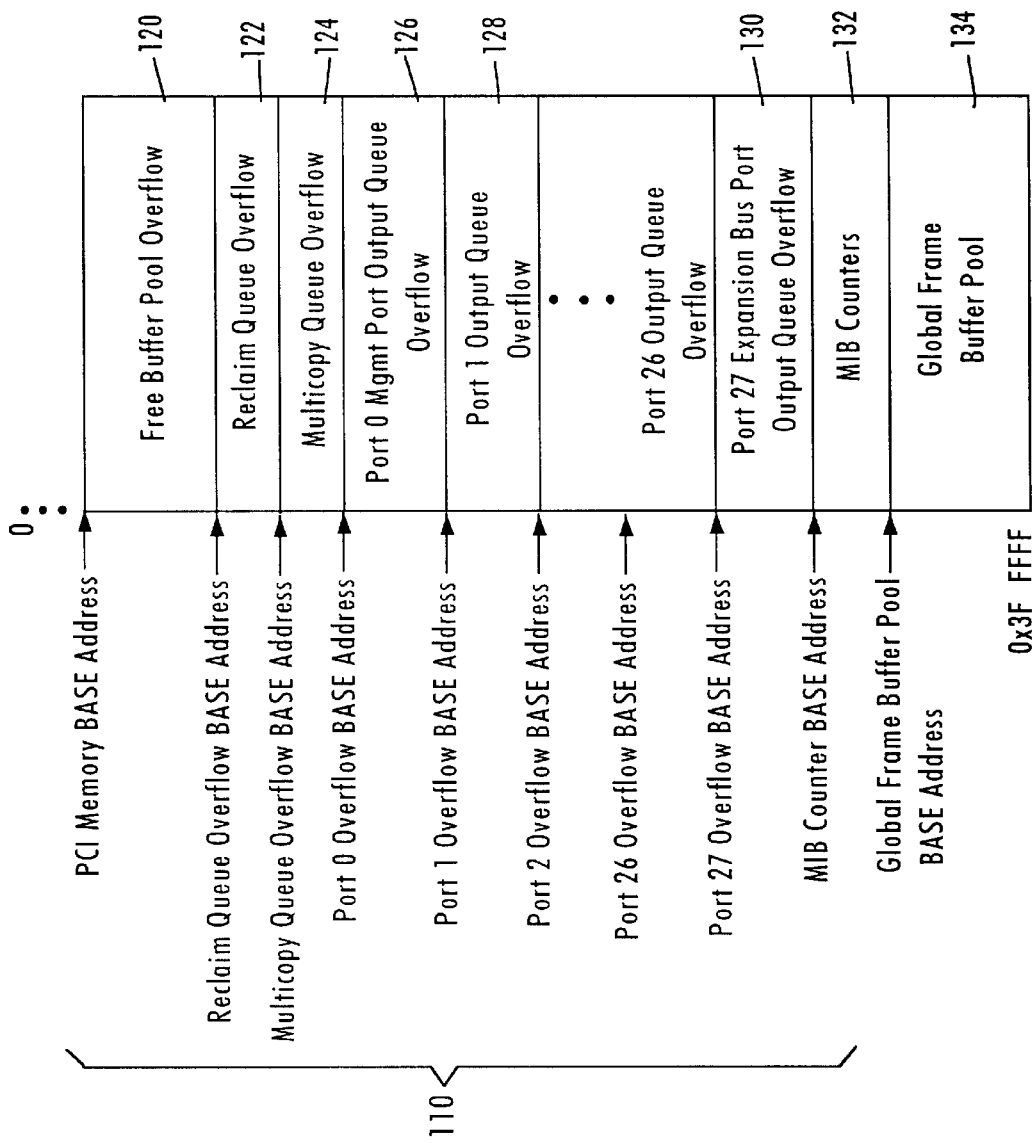
FIG. 4 is a diagram illustrating an exemplary map of an external memory in the multiport switch.

FIG. 4 is a diagram illustrating an exemplary map of the external memory 34. The overall capacity of the external memory 34 may be, for example, 4 Mb, although other capacity memories are employed in different embodiments. The use of an external memory 34 for the overflow areas according to the present invention permits increasing or decreasing the size of the output queues by simply changing the external memory. This is an advantage over systems in which the queue structure is entirely on the chip, as the overall queuing capacity is set at manufacture of the chip.

To satisfy the overflow storage requirements of the switch 12, the overflow region 110 of the external memory 34 has assigned memory portions for a free buffer pool overflow 120, a reclaim queue overflow 122, a multicopy queue overflow 124, a management port output queue overflow 126, output queue overflows 128 for each of the 10 Mb/s and 100 Mb/s destination ports (Ports 0–26), and an expansion bus port (Port 27) output queue overflow 130. The memory 34 also includes assigned portions for the MIB counters 132, and the global frame buffer pool 134.

The BASE Address for the entire memory region is programmable in a memory base address register among the registers 74 on the chip. The BASE Address for each area in the external memory map is programmable in the register set. No length register is required, since the length for a given area is equal to the area from that area's BASE Address to the BASE Address of the next adjacent area in the mapping.

Since the length (and therefore capacity) of each of the individual overflow areas is programmable, the overall capacity of each queue is programmable. This feature of the present invention permits customization of the switch to provide particular output queues with increased capacity, as needed.

The overflow areas 110 store excess entries that do not fit into the control queues on the chip 12. For example, the free buffer pool overflow area 120 stores for the free buffer pool 104 the excess free frame pointers identifying the currently unused buffers in the global frame buffer pool 134. The reclaim queue overflow area 122 stores for the reclaim queue 98 excess frame pointers to linked-list chains that are no longer needed. The multicopy queue overflow area 124 stores for the multicopy queue 90 excess frame pointers with copy numbers ">=1" (for queued frame pointers) and frame pointers with copy numbers "−1" (for successfully transmitted frames). The management port output queue overflow area 126 stores for the management port queue 74 excess assigned frame pointers awaiting transmission to the management port 36 (Port 0). Output queue overflow areas 128 store excess assigned frame pointers awaiting transmission to the appropriate 10 Mb/s ports (Ports 1–24) or 100 Mb/s ports (Ports 25–26) for the respective port queues 67. The expansion bus port output queue overflow area 130 for the expansion bus port (Port 27) queue 77 stores frame pointers awaiting transmission to the expansion bus port.

The MIB counter region 132 contains all the per port statistics which are updated periodically by the switch 12. The switch 12 maintains 8-bit and 16-bit counters on-chip for storing MIB statistics. The switch 12 updates the 32-bit or 64-bit MIB counters in external memory 36 with the frequency required to prevent loss of MIB data.

The global frame buffer pool 134 contains buffers in linked-lists which store received frame data. At any given time, these linked lists contain valid frame data, obsolete buffers which will be returned by the buffer manager 72 to the free buffer pool 104, or locations owned by the PCI host processor 40.

As discussed above, the multiport switch 12 comprises the PCI interface 39 which may be a 32-bit PCI revision 2.1 compliant interface arranged on the IMS chip to support communications with the host processor 40 via the PCI bus 41. The PCI interface 39 allows the PCI host processor 40 to read and write from and to the internal IMS status and configuration registers 74, and to read and write from and to the external memory SDRAM 34. During PCI data transfer operations, the host processor 40 acts as a master that controls the PCI bus 41 to send and receive signals to and from the slave PCI interface 39.

As shown in FIG. 2, the PCI interface 39 comprises 32 address/data bus interface pins AD[31:0]. PCI address and data signals are multiplexed on the same bus interface pins. For the first cycle of a transaction, AD[31:0] contain a 32-bit address. During subsequent clocks of the transaction, the address/data bus interface pins contain data. For example, AD[31:24] may contain the most significant byte, whereas AD[7:0] may correspond to the least significant byte.

The present invention allows 16- and 32-bit data transfers to be performed via the AD[31:0] pins. Also, the PCI interface 39 supports big endian as well as little-endian byte ordering.

In particular, a 32-bit PCI host processor uses all of the AD[31:0] pins for transferring address and data signals. A 16-bit PCI host processor, that employs little endian byte ordering, drives all address bits AD0 to AD31 during the address phase of a PCI transaction, but transfers data on AD15 to AD0 during the data phase of the transaction. A 16-bit PCI host processor, that uses big endian byte ordering, drives all address bits AD0 to AD31 during the address phase of a transaction, but transfers data on AD31 to AD16 during the data phase of the transaction.

Bus command (C) and byte enable (BE) signals are multiplexed on four bus interface pins C/BE[3:0]#. During the address phase of a transaction, the C/BE[3:0]# pins define a 4-bit bus command C. During the data phase, the PCI interface 39 receives a 4-bit BE signal via the C/BE [3:0]#.

Other IMS pins that support PCI interface 39 are briefly described below. PAR pin provides an even parity signal for the signals on the AD[31:0] and C/BE[3:0] pins. FRAME# pin is driven by the PCI host processor 40 at the beginning of the address phase to indicate that valid address and command respectively exist on the AD and C/BE# pins. TRDY# signal indicates the ability of the IMS 12 to complete the current data phase. IRDY# signal indicates the ability of the host 40 to complete the current data phase. STOP# pin is driven by the IMS 12 to request the PCI host 40 to stop the current bus transaction. DEVSEL# pin is driven by the IMS 12 to claim the access cycle for the current transaction after it decodes its address on the AD[31:0] pins. IDSEL pin contains a chip select signal for the IMS 12. PERR# signal is asserted by the IMS 12 if a parity error is detected during the write data phase. SERR# signal is asserted by the IMS 12 if a parity error is detected during the address phase. PCI_CLK signal is used for timing the PCI interface logic. RESET# signals causes the IMS 12 to perform internal system reset. INT# pin provides an interrupt signal.

A bus interface unit configuration register that may be incorporated in the PCI control/status registers 74 is used to configure the PCI interface 39. For example, the configuration register may contain a byte swap bit that depends on the byte ordering of the PCI host processor 40. For example, the byte swap bit may be set to 1, when the PCI interface 39 supports a big-endian host processor, such as a Motorola processor. The byte swap bit may be set to 0, when the PCI interface 39 supports a little-endian host processor, such as an Intel processor.

The host 40 accesses the 32-bit IMS registers 74 through 32 input/output data/address lines connected to the AD[31:0] pins. During the address phase of a PCI transaction, the AD[31:2] signal may define the location of the register to be accessed, while the position within the register may be determined by the AD[1:0] signal. The 4-bit BE[3:0] signal supplied in the data phase may define the byte lane in the register where valid data is transferred.

Figure 5:
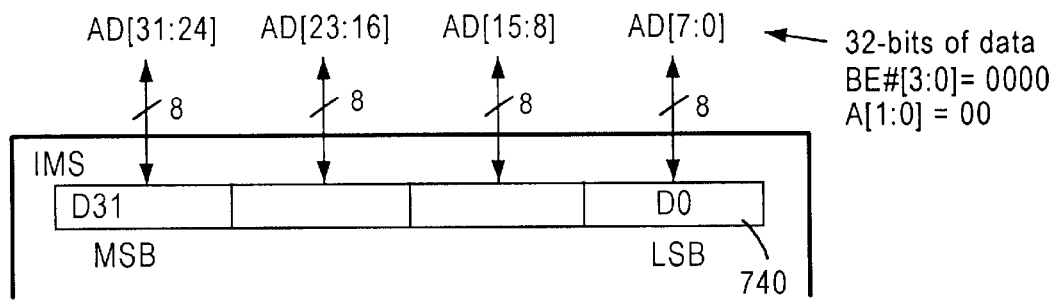
FIGS. 5, 6 and 7 illustrate examples of host accesses to an internal register.

As illustrated in FIG. 5, when the host 40 is a 32-bit processor, a single cycle is required to access any one of the 32-bit IMS registers 74. An access to a 32-bit IMS register 740 is bit oriented rather than byte oriented, therefore, the consideration of host's byte ordering is not required. For example, a 32-bit register access may be identified by BE[3:0]=0000.

However, when the PCI interface 39 supports a PCI access by a 16-bit host 40 to a 32-bit IMS register, any 16-bit write access must be followed by a second write access with the remaining 16 bits of data. A temporary holding register may be provided at the PCI interface 39 for storing the first 16 bits of data transferred during the first access.

The host 40 provides the same address during the address phases of both write accesses, except for the address bit that defines the location within the accessed register. For example, for the second write access, the AD[1] bit may increment the address by 2 byte locations. The SERR# signal is asserted if the address of the accessed register does not remain consistent for both 16-bit register accesses.

A 16-bit little-endian PCI host processor, such as an Intel processor, drives all address bits AD0 to AD31 during the address phase of a PCI transfer but transfers data on AD15 to AD0 during the data phase of the transfer. By contrast, a 16-bit big-endian PCI host processor, such as a Motorola processor, drives all address bits AD0 to AD31 during the address phase of a transfer but transfers data on AD31 to AD16 during the data phase of the transfer. Accordingly, during a 16-bit access to the IMS registers, the byte ordering of the host processor is considered.

Figure 6:
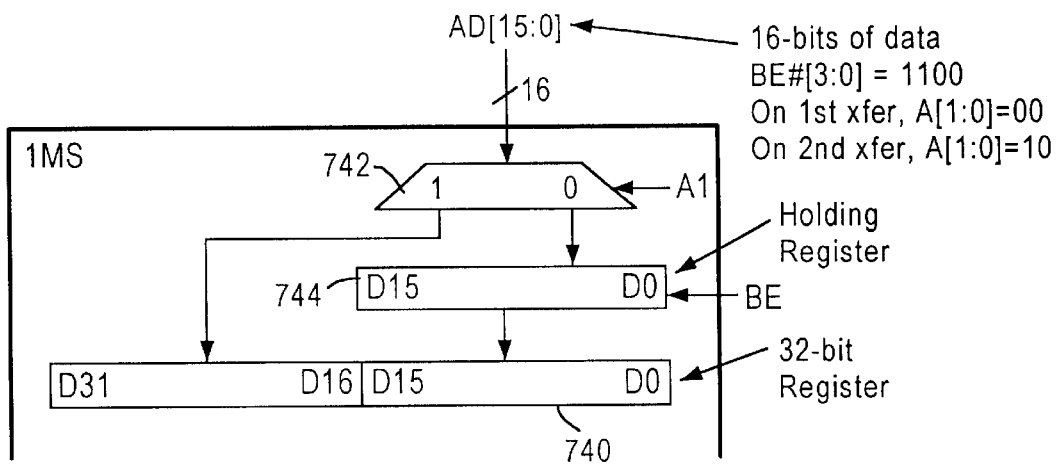

For example, for a PCI access by a 16-bit little-endian host to a 32-bit IMS register 750 illustrated in FIG. 6, the address AD[1:0]=00 may point to bits D15–D0 of the IMS register 740 and address AD[1:0]=10 may point to bits D31–D16 of the IMS register 740. During the address phase of the first write transfer, the address AD[1:0] may be set to 00 to enable the little-endian host to perform a write operation to IMS register bits D15-D0. As indicated above, during the data phase of the write transfer, the little-endian host supplies pins AD[15:0] with its 16-bit data signal. A multiplexer 742 arranged in the PCI interface 39 may be controlled by the bit AD[1] of the address signal to supply the 16-bit data signal from the pins AD[15:0] to a 32-bit holding register 744. The BE signal may be set to 1100 to direct the data signal to first two bytes (bits D15–D0) of the holding register 744.

During the address phase of the second write access the AD[1:0] is set to 10, in order to transfer the remaining 16-bit of data from the 16-bit little endian host to the IMS register 740. During the data phase of the second write access, the multiplexer 742 controlled by the bit AD[1] supplies the data signal from the pins AD[15:0] to IMS register bits D31–D16. Simultaneously, the holding register 744 transfers its bits D15–D0 to IMS register bits D15–D0.

Figure 7:
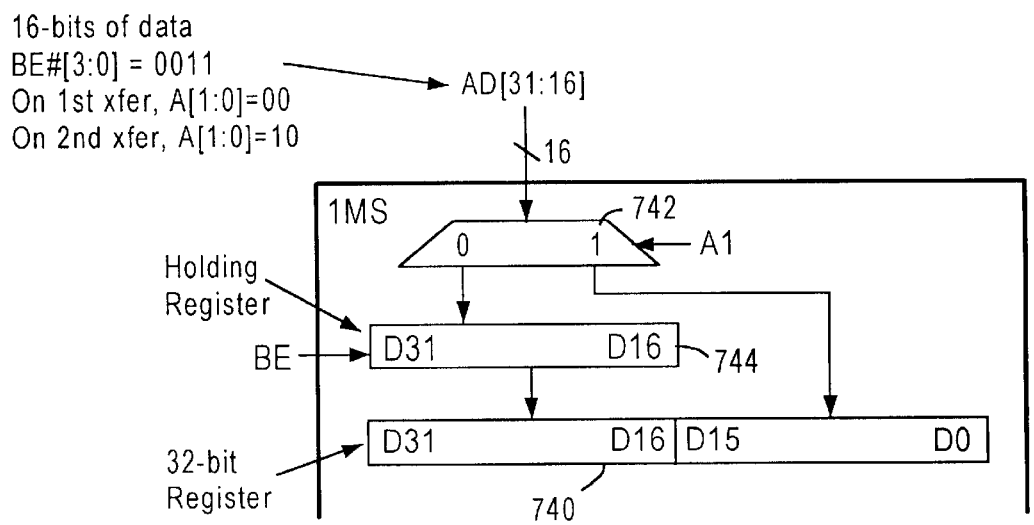

For a PCI access by a 16-bit big-endian host to the 32-bit IMS register 750 illustrated in FIG. 7, address AD[1:0]=00 may point to IMS register bits D31–D16 of the register 750 and address AD[1:0]=10 may point to IMS register bits D15–D0. During the address phase of the first write transfer, the address AD[1:0] may be set to 00 to enable the little-endian host to perform a write operation to IMS register bits D31–D16. During the data phase of the write transfer, the big-endian host supplies pins AD[31:16] with its 16-bit data signal. The multiplexer 742 may be controlled by the bit AD[1] of the address signal to supply the 16-bit data signal from the pins AD[31:16] to the holding register 744. The BE signal may be set to 0011 to direct the data signal to bits D31–D16 of the holding register 744.

During the address phase of the second write access, the AD[1:0] is set to 10, in order to transfer the remaining 16-bit of data from the 16-bit big endian host to the IMS register 740. During the data phase of the second write access, the multiplexer 742 controlled by the bit AD[1] supplies the data signal from the pins AD[15:0] to IMS register bits D15–D0. Simultaneously, the holding register 744 transfers its bits D31–D16 to IMS register bits D31–D16.

Thus, the present invention allows both 16- and 32-bit hosts to access the IMS registers. Further, the PCI interface 39 enables the host 40 to access the external SDRAM 34 coupled to the IMS 12 via the external memory interface 32.

The external memory interface 32 may be a 16-bit synchronous DRAM (SDRAM) interface that allows the IMS 12 and the PCI host to access the external SDRAM 34. An external memory interface clock (M_CLK) may be used to synchronize memory interface operations. The frequency of the M_CLK may be programmable. For example, the M_CLK frequency may be equal to 80, 100 or 120 MHz. The memory interface 32 provides an M_CLK line for supplying the M_CLK signal to the memory 34.

As shown in FIG. 2, the external memory interface 32 may further comprise an 11-bit address input bus M_ADD [10:0] for providing address inputs to the external memory 34. A 16-bit bi-directional data bus DQ[15:0] may be used for transferring data between the IMS 12 and the external memory 34. ENK_SEL signal may provide selection between two independent banks in the memory 34, when the host processor 40 accesses the memory 34. Row address strobe RAS#, column address strobe CAS#, and write enable signal WE# may define operation commands during data reading and writing operations. Data input/output mask line DQM[U:L] enables data output during a read cycle, and provides an input data mask during a write cycle.

Figure 8:
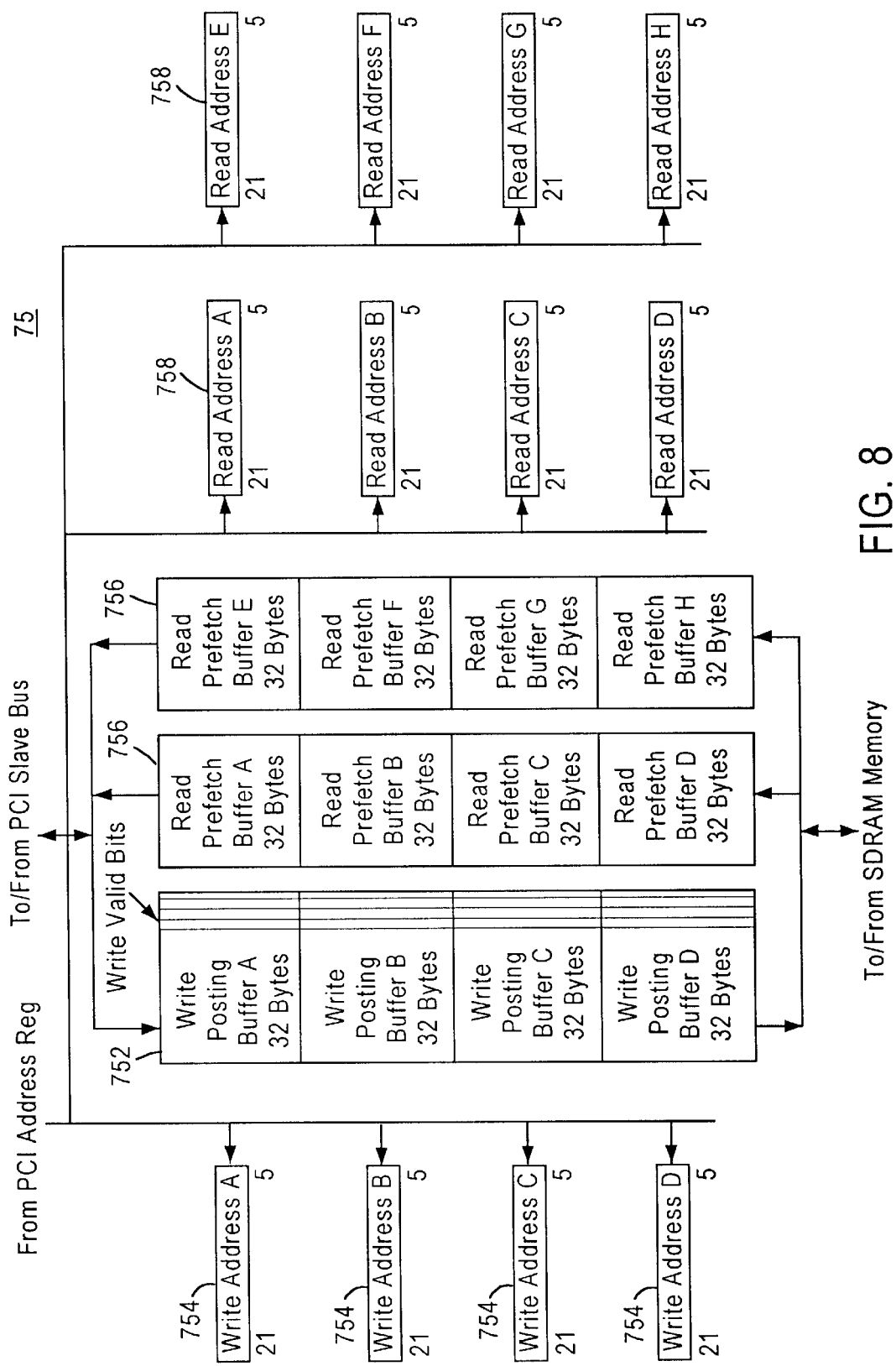
FIG. 8 is a diagram illustrating an exemplary arrangement of posting and prefetch buffers.

As discussed above, the posting and prefetch buffers 75 are arranged between the PCI interface 39 and the external memory interface 32 to support PCI host access to the external memory 34. Referring to FIG. 8, four 32-byte write posting buffers 752 may be available for temporarily storing data received from the PCI bus 41, before writing the data into the external SDRAM memory 34. For example, the write posting buffers may be arranged in one column coupled between the PCI bus 41 and the memory interface 32. Each write posting buffer 752 is provided with an internal write address holding register 754 for storing the posting buffer address transferred from the PCI host during the address phase of a PCI write operation. Write valid bits may be stored in each write posting buffer 752 to indicate which bytes in the buffer are valid.

Eight 32-byte read prefetch buffers 756 may be coupled between the PCI bus interface 39 and the external memory interface 32 to support PCI read operations. The read prefetch buffers 756 temporarily store data prefetched from the SDRAM 34 in anticipation of a request from the PCI host to read that data from the SDRAM 34. The read prefetch buffers 756 may be organized in a number of streams arranged in parallel between the PCI bus interface 39 and the external memory interface 32. For example, FIG. 8 shows two streams of buffers with four read prefetch buffers 756 in each stream. Alternatively, four buffer streams with two read prefetch buffers 756 in each stream may be coupled between the PCI bus interface 39 and the external memory interface 32. The number of the prefetch buffer streams may be preprogrammed according to the number of anticipated PCI host accesses to non-sequential regions of the SDRAM 34. Each prefetch read buffer 756 is provided with an internal read address register 758 that holds the address at which data of the prefetch read buffer 756 is stored in the SDRAM 34.

When a write operation is initiated to write data from the PCI bus 41 to the SDRAM 34, the PCI host writes the SDRAM address, at which the data is to be stored, into the write address register 754 and loads the data into the corresponding write posting buffer 752. Data from the PCI bus 41 may be accepted if any one of the write posting buffers 752 is in an idle state waiting for data to be posted.

Data is held in the write posting buffer 752 until the PCI host completes writing a burst of data or until the address of the data to be written indicates that the burst exceeds the 32-byte boundary of the write posting buffer 752. When either of these conditions occurs, the write posting buffer 752 is locked and waits to transfer its contents to the external memory 34. The data transfer to the external memory 34 is provided via the external memory interface 32 using the corresponding combination of operation commands RAS#, CAS# and WE#.

If a burst of data to be written exceeds the 32-byte boundary of the write posting buffer 752, the next posting buffer 752 is checked to determine whether it is available for accepting the data. If any posting buffer is free, the PCI host writes the remaining data of the burst into the free buffer 752. If all write posting buffers 752 are locked, the PCI burst is terminated, and a disconnect signal is sent to the PCI host. Each burst of data to be stored in non-sequential locations of the external memory 32 is written into a different write posting buffer 752, unless the memory locations fall within the same 32-byte memory region.

The read prefetch buffers 756 temporarily store data prefetched from the external memory 34 before the PCI host initiates a PCI transaction to read that data. The read prefetch buffers 756 may support PCI operations performed to read various SDRAM data, such as MIB data, management port data, expansion bus port data, or routing data from ports 1–26 stored in the corresponding sections of the SDRAM 34.

When the PCI host performs a PCI transaction to read data from the SDRAM 34, address data provided by the host during the address phase of the PCI transaction is compared with address data held in the read address registers 758. If an address match is detected for one of the read prefetch buffers 756, a 32-byte block of data stored in that read prefetch buffer 756 is transferred via the PCI interface 39 to the PCI host.

If no address match is detected, the IMS performs a PCI retry operation to inform the PCI host that requested data is not available. Simultaneously, based on the address provided by the PCI host, the requested data is prefetched from the SDRAM 34 via the external memory interface 32 into one of the read prefetch buffer streams.

The address of the requested data is written into the read address register 758 in the read prefetch buffer 756 that stores the prefetched data. When the PCI host repeats its PCI transaction to read the previously requested data, the prefetched data is immediately transferred from the read prefetch buffers 756 to the PCI host.

Accesses by the host 40 to regions 120–132 of the external memory 34 that do not contain frame data are similar to accesses to the IMS internal registers 74. If the host 40 is a 32-bit processor, 32-bit memory accesses to non-frame data regions 120–132 are bit-oriented, rather than byte-oriented. Accordingly, the byte ordering of the host processor 40 is not required to be considered.

However, 16- and 8-bit memory accesses initiated by a 32- or 16-bit host differ for little-endian and big-endian hosts. Therefore, for 16- and 8-bit memory accesses, the bus interface unit configuration register determines the type of byte ordering. For example, the byte swap bit in the configuration register may be set to 1, when the PCI interface 39 supports a big-endian host processor, and may be set to 0 when a little-endian host initiates a memory access.

Figure 9:
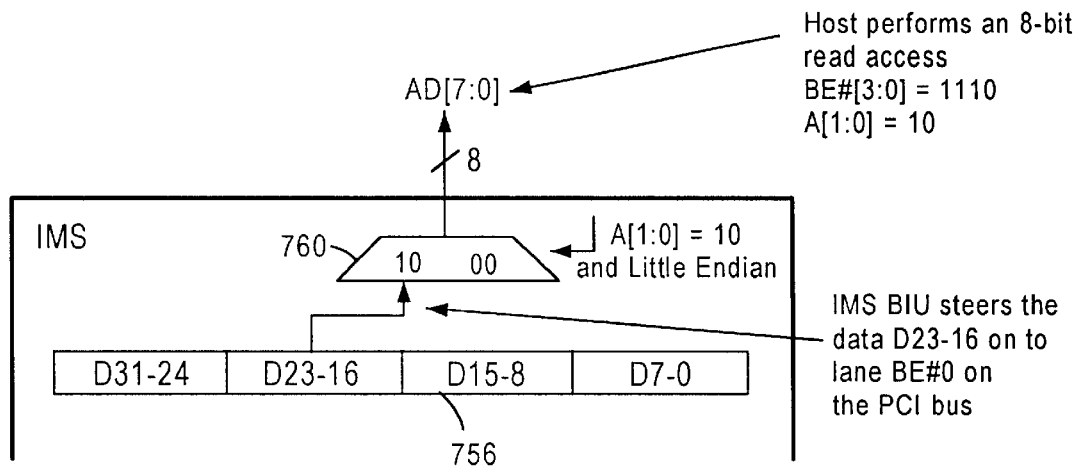
FIGS. 9 and 10 illustrate examples of host accesses to non-frame data locations in an external memory.

FIG. 9 illustrates an example of an 8-bit access initiated by a 16-bit little-indian host to read data from a non-frame region of the external memory 34. The BE#[3:0] signal determines the active byte lanes and the combination of the BE#[3:0] signal with the AD[1] signal determines the memory location within the word to be accessed. In particular, when a 16-bit little indian host initiates an 8-bit access, pins AD[7:0] of the PCI interface 39 are used for transferring address and data signals between the host 40 and the external memory 34. Address AD[1:0]=00 with BE#[3:0]=1110 points to bits D7–D0 of a 4-byte word read from the memory 34, address AD[1:0]=00 with BE#[3:0]= 1110 points to bits D15–D8 of the memory word, address AD[1:0]=10 with BE#[3:0]=1110 points to bits D23–D16 of the memory word, and address AD[1:0] with BE#[3:0]= 1101 points to D31–D24 of the memory word.

As shown in FIG. 9, the prefetch buffer 756 storing data prefetched from the memory 34 is connected to inputs of a multiplexer 760 arranged in the PCI interface 39. The output of the multiplexer 760 is connected to pins AD[7:0] used to provide an 8-bit read access by a 16-bit little indian host 40 to a non-frame region of the external memory 34. The AD[1:0] and byte enable BE# [3:0] signals control the multiplexer 760. For example, as illustrated in FIG. 9, the AD[1:0] signal set at 10, and the BE# [3: 0] signal equal to 1110 control the multiplexer 760 to connect its input supplied with bits D23–D16 of the prefetch buffer 756 to its output coupled to pins AD[7:0]. Thus, the multiplexer 760 steers data read from required locations of the memory 34 to required PCI interface pins. As a result, both 32-bit and 16-bit hosts are enabled to read data from non-frame regions of the external memory 34.

Figure 10:
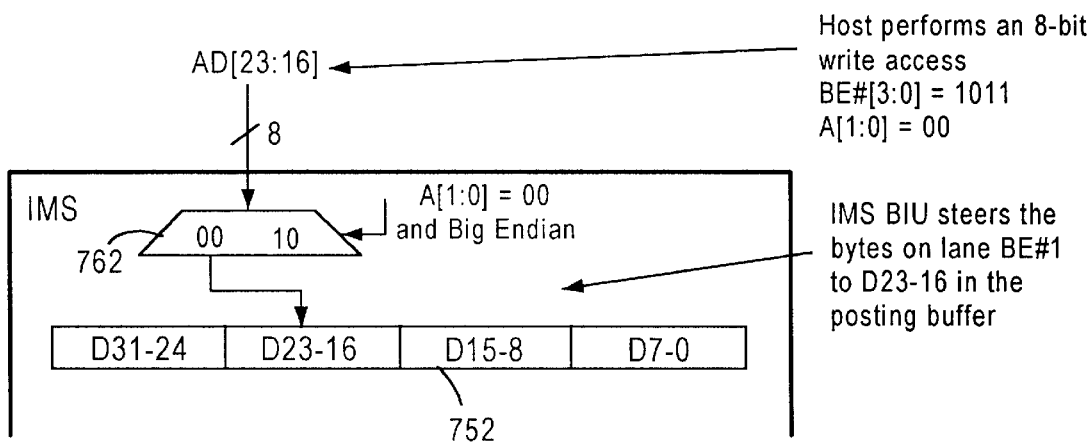

FIG. 10 illustrates writing data from the host 40 to a non-frame region of the external memory 34. The BE#[3:0]

signal determines the active byte lanes, and the combination of the BE#[3:0] signal with the AD[1] signal determines the location within the memory word. For example, when a 16-bit big-endian host performs an 8-bit write access to a non-frame region of the external memory 34, PCI interface pins AD[23:16] are used for transferring address and data signals between the host and the memory. A multiplexer 762 is arranged between the AD pins and the posting buffer 752 for steering data from required AD pins to required locations of the posting buffer 752. The AD [1:0] and byte enable BE#[3:0] signals control the multiplexer 762. For example, as illustrated in FIG. 10, the AD[1:0] signal set at 00, and the BE#[3:0] signal equal to 1011 control the multiplexer 762 to connect its input coupled to pins AD [23:16] to its output coupled to locations D23–D16 of the posting buffer. Accordingly, both 32-bit and 16-bit hosts are enabled to write data to non-frame regions of the external memory 34.

Moreover, the host 40 can perform 8-, 16-, or 32-bit access to the frame data region 134 of the external memory 34. Byte positions of a little-endian host correspond to byte positions in the frame data region of the memory 34. However, as the frame data in the memory 134 is byte-oriented, byte positions of transferred data are swapped when the PCI interface is configured to support a big-endian host.

Figure 11:
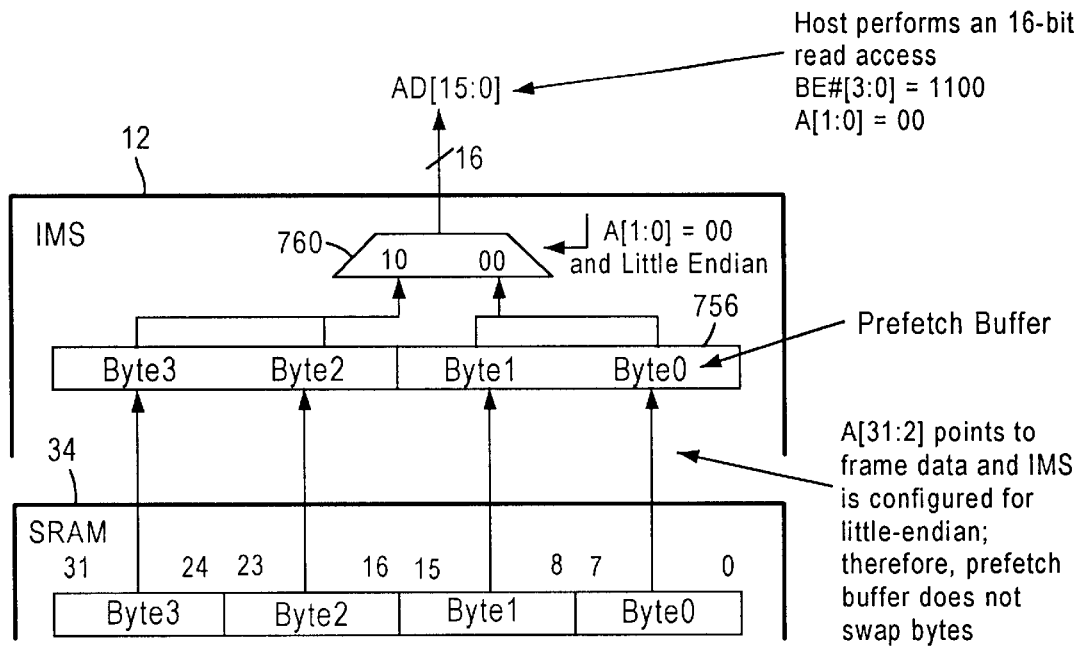
FIGS. 11–14 illustrate examples of host accesses to frame data locations in the external memory.
Figure 12:
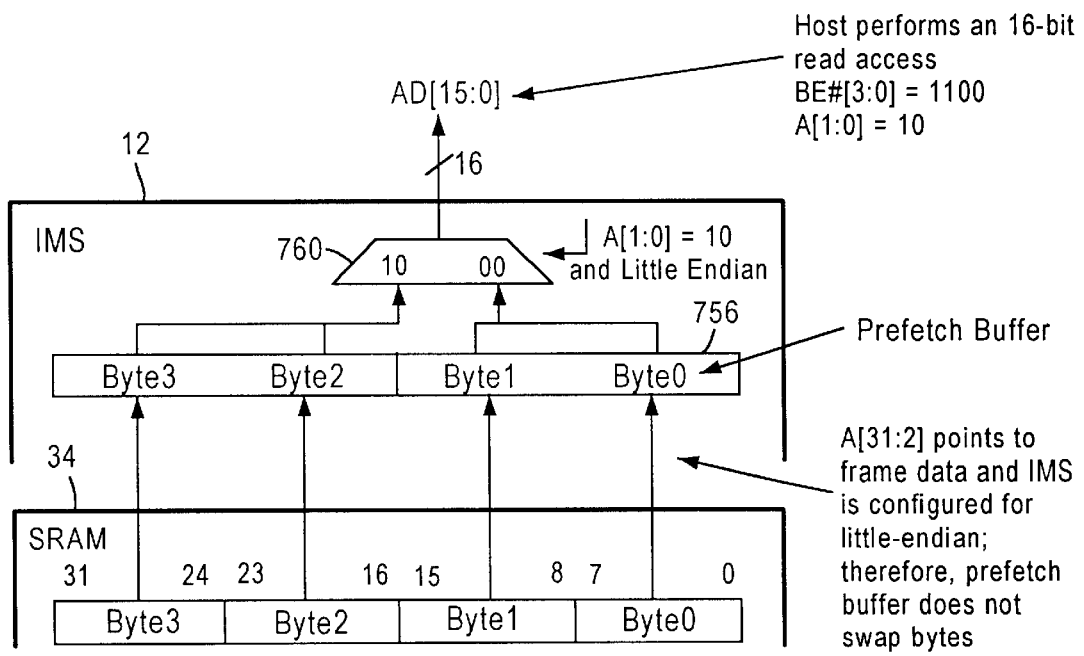

For example, FIGS. 11 and 12 illustrate 16-bit accesses initiated by a 16-bit little-endian host 40 to read data from the frame data region 134 in SDRAM 34. In the example shown in FIG. 11, the BE[3:0] and AD[1:0] signals that determine the memory location to be accessed are respectively set to 1100 and 00. The AD[31:2] signal is set to point to the required frame data.

As the PCI interface 39 supports a little-endian host, the byte swap bit in the configuration register of the IMS may be set to 0. In this case, the prefetch buffer 756 that receives data from the SRAM 34 does not swap bytes of the frame data. The byte ordering in the prefetch buffer 756 corresponds to the byte ordering of the accessed frame data.

The AD[1:0] signal set to 00 controls the multiplexer 760 to supply bytes 0 and 1 (bits D15–D0) from the prefetch buffer 756 to the AD[15:0] pins that supports a 16-bit little-endian host. As shown in FIG. 12, when the AD[1:0] signal is switched to 10 and the BE[3:0] signal remains equal to 1100, the multiplexer 760 is controlled to supply bytes 2 and 3 (bits D31–D16) from the prefetch buffer to the AD[15:0] pins. Thus, the multiplexer 760 provides steering of frame data read from the external SDRAM 34 to the 16-bit little-endian host.

Figure 13:
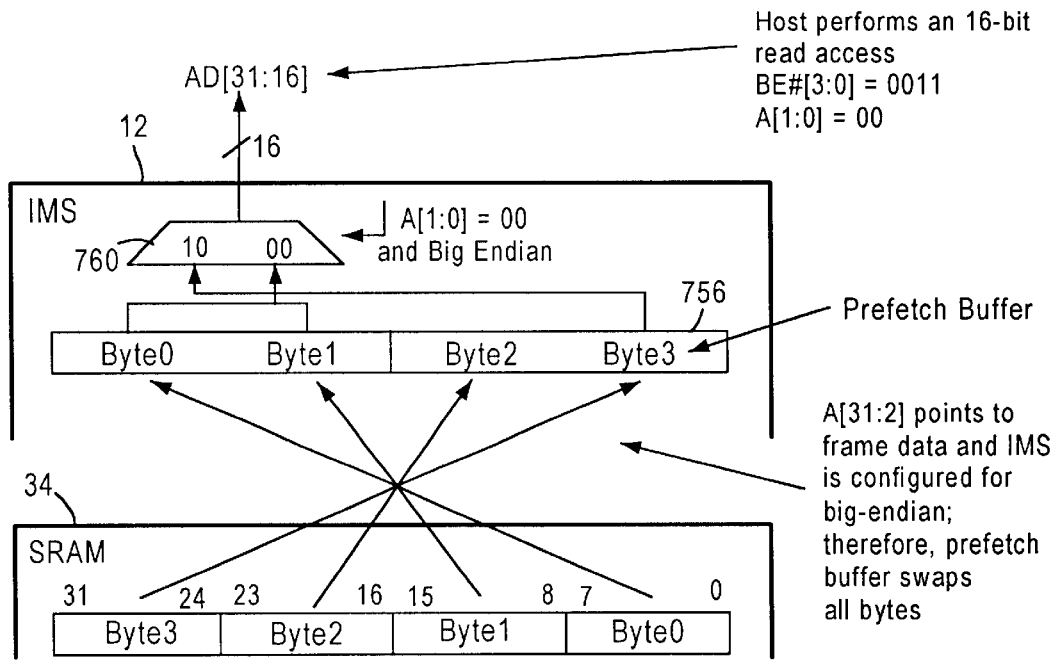
Figure 14:
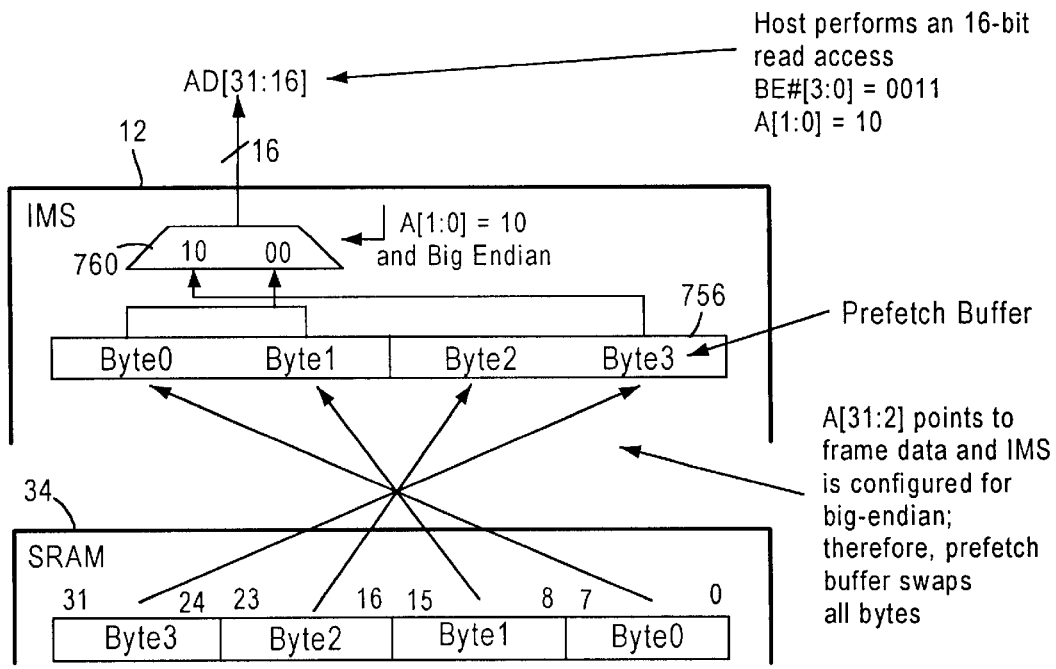

FIGS. 13 and 14 illustrate 16-bit accesses initiated by a 16-bit big-endian host 40 to read data from the frame data region 134 in SDRAM 34. In the example shown in FIG. 13, the BE[3:0] and AD[1:0] signals are respectively set to 0011 and 00. The AD[31:2] signal is set to point to the required frame data.

As the PCI interface 39 supports a big-endian host, the byte swap bit in the configuration register of the IMS may be set to 1. In this case, bytes of the frame data read from the SDRAM 34 into the prefetch buffer 756 are swapped. For example, byte 0 is moved from the right-most position in the SDRAM location to the left-most position in the prefetch buffer 756. The second from the right byte 1 of the SDRAM location is transferred to the second from the left position in the prefetch buffer 756. Byte 2 is moved from the second from the left position in the SDRAM location to the second from the right position in the prefetch buffer 756. Finally, the left-most byte 3 of the SDRAM location is transferred to the right-most position in the prefetch buffer 756.

The AD[1:0] signal set to 00 controls the multiplexer 760 to supply bytes 0 and 1 (bits D15–D0) from the prefetch buffer 756 to the AD[31:16] pins that support a 16-bit big-endian host.

As shown in FIG. 14, when the AD[1:0] signal is switched to 10 and the BE[3:0] signal remains equal to 0011, bytes of the data read from the SDRAM 34 into the prefetch buffer 756 are swapped, and the multiplexer 760 is controlled to supply bytes 2 and 3 (bits D31–D16) from the prefetch buffer 756 to the AD[31:16] pins. Thus, to provide a 16-bit big-endian host with access to the external memory 34, the PCI interface 39 provides swapping of data, in addition to steering of data.

There accordingly has been described a PCI interface that supports a 16- or 32-bit PCI host employing little-endian or big-endian byte ordering. The PCI interface may be arranged on a multiport switch to enable a PCI host to access internal registers and an external memory via a PCI bus. When a 16-bit PCI host is provided with access to a 32-bit internal register, two consecutive 16-bit data transfers are performed. The first 16 bits of data are temporarily stored in a holding register until the following 16 bits are transferred. PCI host accesses to the external memory are performed via posting write buffers and prefetch read buffers arranged between an external memory interface and the PCI interface. When the multiport switch is configured to support a big-endian PCI host, bytes of a word transferred between the external memory and a write or read buffer are swapped to rearrange byte ordering of the word. A data steering means is arranged between the PCI bus and the write or read buffer to connect required pins of the PCI interface with a required location in the buffers.

In this disclosure, there is shown and described only the preferred embodiment of the invention, but, as aforementioned, it is to be understood that the invention is capable of use in various other combinations and environments and is capable of changes or modifications within the scope of the inventive concept as expressed herein.

What is claimed is:

1. In a data communication network, a system for providing a host with access to a memory via a PCI bus, comprising:
    a buffer for temporarily storing a data word transferred between said PCI bus and said memory, and
    a data steering circuit for connecting a predetermined data path of said PCI bus to predetermined location of said buffer in response to a data steering signal.

2. The system of claim 1 further comprising a byte swapping circuit for changing order of bytes in said data word when said data word is transferred between said memory and said buffer.

3. The system of claim 2, wherein said byte swapping circuit is responsive to a first byte swapping signal for changing order of bytes in said data word when said data word is transferred between said memory and said buffer, and is responsive to a second byte swapping signal for maintaining the order of bytes in said data word when said data word is transferred between said memory and said buffer.

4. The system of claim 2, wherein a plurality of data transfers is performed for transferring said data word between said host and said memory.

5. The system of claim 1 further comprising a holding register for temporarily storing data of a first data transfer performed for transferring said data word.

6. The system of claim 5, wherein the data of said first data transfer are transmitted from said holding register to said memory when said host performs a second data transfer directly to said memory.

7. A data communication system comprising:

a host processor, and a data communication switch controlled by said host processor for supporting data exchange between communication ports, and having an internal register, and a PCI interface for providing said host processor with access to said internal register, said host processor being configured to perform a plurality of data transfers to write data into said internal register, said PCI interface having a holding register for temporarily storing data of a first data transfer performed by said host processor, and being configured to transmit the data of said first data transfer from said holding register to said internal register when said host processor performs a second data transfer directly to said internal register.

8. The system of claim 7, wherein said PCI interface is arranged to provide big-endian and little-endian hosts with access to said memory.

9. The system of claim 7, further comprising a memory device external with respect to said data communication switch.

10. The system of claim 9, wherein said data communication switch comprises a buffer for temporarily storing data transferred between said external memory device and said host processor.

11. The system of claim 10, wherein said external memory contains a word having bytes arranged in a predetermined order.

12. The system of claim 11, wherein said data communication switch produces a first byte arranging signal to change the order of said bytes when said word is transferred to said buffer.

13. The system of claim 12, wherein said data communication switch produces a second byte arranging signal to maintain the order of said bytes when said word is transferred to said buffer.

14. The system of claim 11, wherein said PCI interface further comprises a data steering circuit for supplying predetermined bytes of said word from said buffer to predetermined data paths of said PCI interface to support reading data by said host processor from said memory device.

15. The system of claim 14, wherein said data steering circuit supplies predetermined bytes from said host processor to predetermined locations of said buffer to support writing data by said host processor into said memory device.

* * * * *

UNITED STATES PATENT AND TRADEMARK OFFICE
CERTIFICATE OF CORRECTION

PATENT NO.    : 6,393,548 B1                                           Page 1 of 1
DATED         : May 21, 2002
INVENTOR(S)   : Denise Kerstein et al.

It is certified that error appears in the above-identified patent and that said Letters Patent is hereby corrected as shown below:

<u>Title page,</u>
Item [75], Inventors, change the city of residence for the first inventor from "Mountain View" to -- Palo Alto --.

Signed and Sealed this

First Day of October, 2002

Attest:

Attesting Officer

JAMES E. ROGAN
Director of the United States Patent and Trademark Office